United States Patent [19]

Varadarajan

[11] Patent Number: 4,538,075

[45] Date of Patent: Aug. 27, 1985

[54] HIGH SPEED REFERENCELESS BIPOLAR LOGIC GATE WITH MINIMUM INPUT CURRENT

[75] Inventor: Hemmige D. Varadarajan, Sunnyvale, Calif.

[73] Assignee: Advanced Micro Devices, Inc., Sunnyvale, Calif.

[21] Appl. No.: 529,917

[22] Filed: Sep. 7, 1983

[51] Int. Cl.³ .................... H03K 17/04; H03K 19/086
[52] U.S. Cl. .................... 307/454; 307/443; 307/455; 307/561; 307/264
[58] Field of Search .............. 307/443, 454–456, 307/467, 561, 565, 254, 264, 300

[56] References Cited

U.S. PATENT DOCUMENTS

| | | | |
|---|---|---|---|
| 3,753,005 | 8/1973 | Bertram et al. | 307/455 X |
| 3,778,646 | 12/1973 | Masaki | 307/455 |
| 4,165,470 | 8/1979 | Fulkerson | 307/454 |
| 4,394,588 | 7/1983 | Gaudenzi | 307/443 |

Primary Examiner—Stanley D. Miller
Assistant Examiner—D. R. Hudspeth
Attorney, Agent, or Firm—Patrick T. King; J. Vincent Tortolano

[57] ABSTRACT

In a logic gate which is provided having input transistors each with a collector electrode at a first node (which serves as a signal output node), an emitter electrode at a second node to which all emitters are coupled and a base electrode for receiving binary logic signal input, and further having a load resistor between the first node and a supply voltage coupling, the improvement in that means are provided for controlling the emitter current at the second node in response to voltage on the first node in order to inhibit saturation of the input transistors and to enhance switching speed of the logic gate. The emitter current controlling means may include a current regulating transistor coupled between the second node and a ground reference wherein the base electrode thereof is coupled through a third node to a biasing means coupled to the first node. The current regulating transistor may be a Schottky transistor, that is, a transistor with a Schottky diode coupled between the base electrode and the collector electrode. The biasing means may be a feedback resistor coupled between the first node and the third node. Voltage across the feedback resistor may be clamped to limit voltage range.

9 Claims, 3 Drawing Figures

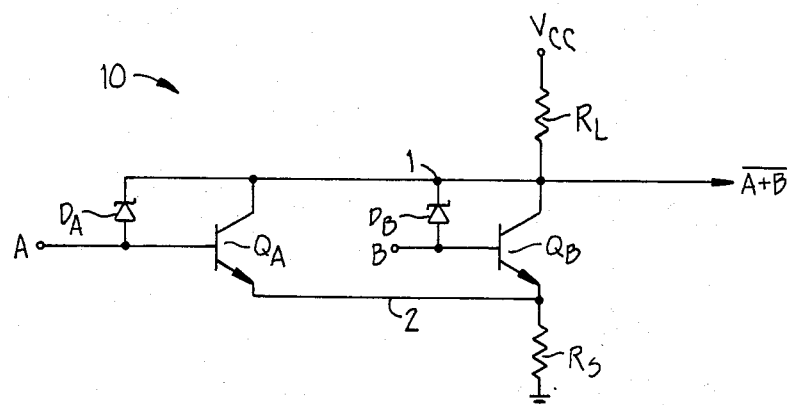
*Fig._1_* (PRIOR ART)
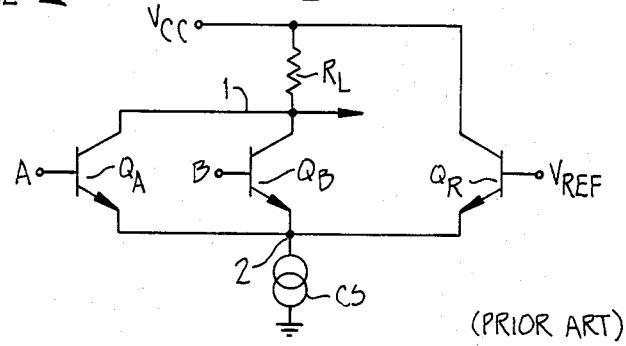
(PRIOR ART)
*Fig._2_*
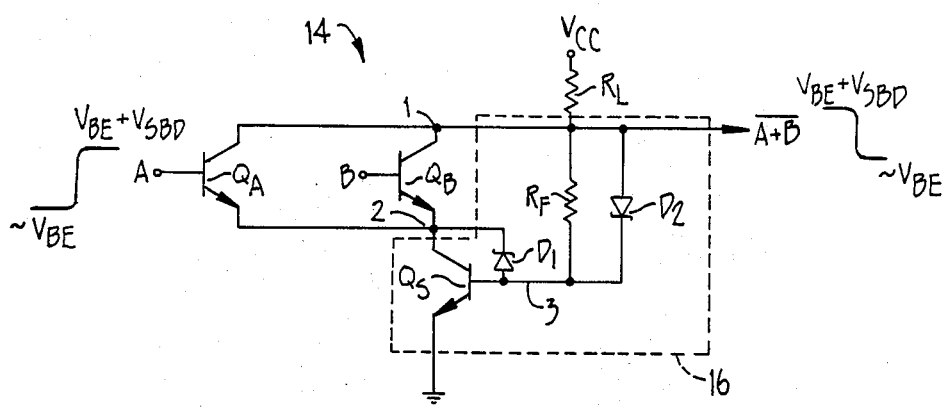
*Fig._3_*

HIGH SPEED REFERENCELESS BIPOLAR LOGIC GATE WITH MINIMUM INPUT CURRENT

BACKGROUND OF THE INVENTION

1. Field of the Invention

This invention relates to digital circuitry and more particularly to a logic gate useful as a building block in bipolar digital circuit devices. Digital gates are primitive circuits used for performing boolean functions on electronic signals. They are frequently employed in complex devices having a large number of elements to perform specified logic functions. One of the limiting factors in a logic gate is the speed of operation. Complex logic functions involving any circuits are ideally performed in a minimum amount of time and consume a minimum amount of power. There is always a trade-off between power and speed. What is needed is a circuit which maximizes speed of operation for a given power dissipation.

2. Description of the Prior Art

There are numerous types of primitive logic gates, that is basic logic gates which serve as system building blocks. They are generally classified by characteristics of the circuit. For example, transistor transistor logic (TTL) involves the use of at least two transistors, generally constructed employing bipolar technology, in series to conduct a signal and to perform a primitive logic function such as a NAND or a NOR function. Emitter coupled logic (ECL) employs transistors wherein the emitters are coupled and saturation of the transistors is inhibited to increase switching speed. Many proposals have been made for enhancing the speed of logic gates. However, the simplest and most straightforward proposals, such as those built around a single transistor, often suffer from the inherent problem of inability to operate fast over wide temperature ranges due to changes in the base emitter voltage with temperature.

Referring to FIG. 1, there is shown one prior art embodiment of a primitive logic gate for use in an inverting OR function. This logic gate is generally referred to as a direct coupled transistor transistor logic gate (DCTTL). A description of DCTTL is found in "Direct-Coupled Transistor Transistor Logic: A New Performance LSI Gate Family," D. E. Fulkerson, *IEEE Journal of Solid State Circuits*, Volume SC-10, page 110 (April 1975). A DCTTL logic gate 10 comprises a first transistor $Q_A$, a second transistor $Q_B$ coupled between a first node and a second node with a load resistor $R_L$ coupled between the first node and the voltage source and a small fan-out resistor $R_S$ coupled between the second node and the ground reference. Critical to the fast operation of this gate are clamping diodes, such as Schottky diodes $D_A$ and $D_B$ coupled between the base electrode and a collector electrode (node 1) of each of the transistors $Q_A$ and $Q_B$. Output is through the connection at node 1. But for the clamping diodes $D_A$ and $D_B$, the circuit would operate extremely slowly. The clamping diodes prevent full saturation of the transistors $Q_A$ and $Q_B$ so that a single transistor switching function is possible. The small fan-out resistor $R_S$ in addition to enhancing the fan-out ability at node 1, helps to reduce the likelihood of malfunction over a wide temperature range. This function may be referred to as current hogging prevention.

Referring to FIG. 2, there is shown another prior art circuit generally referred to as a current mode logic gate 12. A description of CML is found in "A 1500 Gate, Random Logic Large Scale Integrated (LSI) Masterslice," R. J. Blumberg and S. Brenner, *IEEE Journal of Solid State Circuits*, Volume SC-14 No. 5, page 818 (October 1979). A first transistor $Q_A$ and a second transistor $Q_B$ are coupled between a first node 1 and a second node 2. The first node 1 serves as the output terminal for the gate 12, and a load resistor $R_L$ is coupled between the voltage source coupling $V_{CC}$ and the first node 1. A current source $C_S$, such as a resistor or a suitably biased transistor, is coupled between the second node 2 and the ground reference. The current source $Q_S$ in combination with a voltage reference transistor $Q_R$ which is coupled also to the second node 2 establishes the threshold at which the gate 12 switches. The reference transistor $Q_R$ is coupled between the second node and the voltage source coupling $V_{CC}$. The current mode logic is related to emitter coupled logic in that it is a non-saturating logic family.

While there are advantages to each of the prior art circuits, there is also room for improvement. The DCTTL gate 10 draws a high base current, which is a distinct disadvantage in applications wherein such a gate forms a basic building block in a complex circuit. The CML logic gate 12 requires an external voltage reference for the reference transistor $Q_R$ and frequently for the current source $C_S$. Thus, extra wiring is required with its concomitant disadvantages, and it also runs the risk of input device saturation at high temperatures.

SUMMARY OF THE INVENTION

According to the invention, in a logic gate having at least one input transistor with a collector electrode at a first node which serves as a signal output node, an emitter electrode at a second node to which all emitters are coupled, and a base electrode for receiving binary logic signal input, and further having a load resistor between the first node and a supply voltage coupling, the improvement wherein means are provided for controlling the emitter current at the second node in response to voltage on the first node in order to inhibit saturation of the input transistors and to enhance switching speed of the logic gate. The emitter current controlling means may include a current regulating transistor coupled between the second node and a ground reference wherein the base electrode thereof is coupled through a third node to a biasing means coupled to the first node. The current regulating transistor may be a Schottky transistor, that is, a transistor with a Schottky diode coupled between the base electrode and the collector electrode. The biasing means may be a feedback resistor coupled between the first node and the third node. Voltage across the feedback resistor may be clamped to limit voltage drop. The invention will be better understood by reference to the following detailed description taken in connection with the accompanying drawings.

BRIEF DESCRIPTION OF THE DRAWINGS

FIG. 1 is a schematic diagram of one prior art primitive logic gate, as previously described.

FIG. 2 is a schematic diagram of a second prior art primitive logic gate, as previously described.

FIG. 3 is a schematic diagram of a primitive logic gate in accordance with the invention.

DESCRIPTION OF SPECIFIC EMBODIMENTS

Referring to FIG. 3, there is shown a bipolar primitive logic gate circuit 14 according to the invention.

NPN-type devices are conventionally employed. The circuit gate 14 comprises a first input transistor $Q_A$, a second input transistor $Q_B$, a load resistor $R_L$ and an emitter current controlling means 16. For consistency the same designations as employed in the description of the prior art are employed throughout the Figures. The emitter current controlling means 16 comprises a current source transistor $Q_S$ coupled between node 2 and a ground reference in a position normally occupied by a fixed current source in a current mode logic gate or emitter coupled logic gate. However, unlike such other logic gates, the bias of the current source is here feedback controlled. The circuit has three principle nodes. The first node 1 to which are connected the collectors of the input transistors $Q_A$ and $Q_B$ and the load resistor $R_L$, the second node 2 to which are connected the emitters of the input transistors $Q_A$ and $Q_B$ and the collector of the current source transistor $Q_S$, and a third node 3 to which the base of the current source transistor $Q_S$ is coupled. The emitter current controlling means 16 comprises in addition a feedback resistor $R_F$ coupled between the first node 1 and the third node 3 which provides a feedback signal from the first node 1 at the collectors to the base of the current source transistor $Q_S$. The current source transistor $Q_S$ may be a Schottky transistor or more specifically a transistor with a first Schottky diode $D_1$ coupled between the base electrode and collector electrode (node 3 and node 2) across the current source transistor $Q_S$. A second Schottky diode $D_2$ may serve as a clamp across the feedback resistor $R_F$ to prevent excessive voltage drop between node 1 and node 3.

The input transistors $Q_A$ and $Q_B$ conduct when an input signal is high, thus enabling a positive NOR function as seen at the output through node 1. The collector load resistor $R_L$ allows the output node (node 1) to go low as the input goes high and either one of the input transistors $Q_A$ or $Q_B$ begins to conduct. The current source transistor $Q_S$ is always held in conduction by resistors $R_L$ and $R_F$. The first Schottky diode $D_1$ limits saturation of the current source transistor $Q_S$ to so-called soft saturation by stealing current from the base thereof. The first Schottky diode $D_1$ also holds the voltage at node 2 at a sufficiently high level to assure that the input transistors $Q_A$ and $Q_B$ can be turned off completely.

The invention will be better understood by analysis of operation of the invention. Consider input signals, voltages A and B moving between voltage levels $V_{BE}$ which is about 0.7 volts nominal and $V_{BE}+V_{SBD}$, which is about 1.2 V max at room temperature. The subscript BE refers to base emitter voltage drop and the subscript SBD refers to the Schottky barrier diode voltage drop during conduction state. Ignoring the clamping effects of the second Schottky diode $D_2$, simple calculations show that the output level at node 1 for a high stage is equal to the base emitter drop of the collector source transistor $Q_S$ plus the quantity of the source voltage $V_{CC}$ less the base emitter voltage of $Q_S$ times the value of the feedback resistor $R_F$ all divided by the sum of the values of the feedback resistor $R_F$ and the load resistor $R_L$. This value is expressed as:

$$V_{HIGH} = V_{BEQ3} + (V_{CC} - V_{BEQ3}) \frac{R_F}{R_L + R_F}$$

Since all the current drain through $Q_S$ is coming through the load resistor $R_L$ and the feedback resistor $R_F$ when the output is high, $Q_A$ and $Q_B$ being off, this relationship holds.

When the input signal goes high to turn on either $Q_A$ or $Q_B$, the collector current of $Q_S$ pulls down the output at node 1 through either $Q_A$ or $Q_B$ until the output voltage at node 1 is the base emitter voltage drop of $Q_S$. If the transistor current gains are not unduly low, then the voltage drop across the resistor $R_F$ in this approximation may be ignored for tutorial purposes. It is important to note here that the high and low output levels of this gate are well defined and stable so long as $Q_A$ and $Q_B$ are either on or off. The switching levels of this gate are largely unaffected by supply voltage variations which would have deleterious effects on switching in other types of primitive gates. It can also be seen that as the input voltage rises from the low level, $Q_A$ does not begin conducting significantly until the input voltage level reaches about 0.85 volts (which is the minimum value $V_{BE}-V_{SBD}+V_{TH}$, at room temperature where $V_{TH}$ is the threshold of conduction for the input element, about 0.6 volt), thus retaining a stable up level and providing a good DC noise margin for the circuit. The Schottky diode $D_1$ helps to maintain the voltage at node 2 at a stable level during this transition and the circuit output at node 2 is not perturbed by small spikes or shifts in the levels of the input.

The first Schottky diode $D_1$ also starves the base of $Q_S$ so that $Q_S$ does not saturate heavily. This has the effect of inhibiting ringing at node 1 as the voltage at node 1 moves from high to low. Thus, soft saturation, implemented through the use of the Schottky diode $D_1$, enhances speed and limits undesired oscillation.

The second diode $D_2$ is used to prevent undesired saturation of input devices coupled to node 1. For example, if a gate 14 were coupled to another primitive gate 14 in a series of gates, the input transistors $Q_A$ and $Q_B$ run the risk of saturation as the voltage on node 2 increases above twice the base emitter voltage level. Such a voltage is above the design HIGH logic state of the circuit of this type. The HIGH voltage level is therefore limited to a base emitter drop (through an emitter current transistor $Q_S$) plus a diode drop (through a Schottky diode). Such higher levels of input voltage degrade speed of circuit operation and are to be avoided.

DC power dissipation of primitive logic gates are also important to understand. The power dissipation of the logic gate 14 according to the invention is readily calculated and is practically independent of input fan-in or output fan-out. The value of dissipation is given by the following equation:

$$\text{Dissipation} = \frac{V_{CC} - \left(V_{BE} + \frac{V}{2} SBD\right)}{R_1} \times V_{CC}$$

In other words, dissipation is equal to average gate current times the supply voltage. When operated with a supply voltage of approximately 2 volts, the dissipation and the delay do not vary widely with temperature because varying $V_{BE}$ is compensated by varying resistor values.

The output impedance of the device is equivalent to the parallel resistance of the load resistor $R_L$, and feedback resistor $R_F$ and the impedance of the second Schottky diode $D_2$. Input impedance is high, if the input gates are normally off. Base current, however, is required at the input when any of the input gates are turned on. Saturation is of course limited by clamping the input gates (with the previous output gates) to a level of $V_{BE}+V_{SBD}$ as described hereinabove.

Results of measurements of devices constructed in accordance with the invention compare favorably with other primitive gate designs. A gate design according to the present invention has a good power-delay product which is far superior to conventional TTL and even superior to conventional ECL primitive logic gates. The present invention is also advantageous over TTL logic in that only a single device is switched in each stage so that propagation delay is minimized. The design is also temperature stable as compared with other known single gate designs.

The invention has been explained with reference to specific embodiments. Other embodiments will be apparent to those of ordinary skill in the art. For example, PNP transistors can be used with appropriate power supplies where NPN transistors have been used as examples. Single or multiple parallel input transistors can also be employed. It is therefore not intended that this invention be limited except as indicated by the appended claims.

What is claimed is:

1. A logic gate having at least one input transistor means, each said input transistor means having a collector electrode connected to a first node, said first node being an output signal node, an emitter electrode connected to a second node and a base electrode for receiving binary logic signal input, and said gate further having a load resistor between said first node and a supply voltage terminal, the improvement comprising:

means coupled to said second node and responsive to the voltage on said first node for controlling emitter current of said input transistor means through said second node to inhibit saturation of said input transistor means; and means coupled to said first node, and further coupled to said emitter current controlling means, for limiting the output voltage of said logic gate by clamping said output voltage to a maximum value.

2. A logic gate according to claim 1 wherein said emitter current controlling means comprises a current regulating transistor means having a collector electrode coupled to said second node, an emitter electrode coupled to a ground reference terminal and a base electrode coupled through a third node to a biasing means, said biasing means being coupled to said first node.

3. A logic gate according to claim 2 wherein said current controlling means further includes a first Schottky diode having a cathode electrode coupled to said second node and an anode electrode coupled to said third node, said transistor means being NPN transistors.

4. A logic gate according to claim 3 wherein said biasing means comprises a feedback resistor, said feedback resistor being coupled between said first node and said third node such that a change in voltage level at said first node causes a controlled change in voltage level and current at said third node to control base current to said current regulating transistor.

5. The logic gate according to claim 1 wherein said means for limiting the output voltage of said logic gate is a second Schottky diode having an anode electrode coupled to said first node and a cathode electrode coupled to said third node.

6. The logic gate according to claim 1 wherein said logic signal input is restricted to a range of about a base-emitter voltage drop of a bipolar junction transistor when forward biased ($V_{BE}$) to about $V_{BE}+$ a voltage drop across a Schottky barrier diode during conduction state ($V_{SBD}$).

7. A logic gate having at least one input transistor means, each said input transistor means having a collector electrode connected to a first node, said first node being an output signal node, an emitter electrode connected to a second node and a base electrode for receiving binary logic signal input, and said gate further having a load resistor between said first node and a supply voltage terminal, the improvement comprising:

means coupled to said second node and responsive to the voltage on said first node for controlling emitter current of said input transistor means through said second node to inhibit saturation of said input transistor means; and biasing means coupled through a third node to said emitter current controlling means and further coupled to said first node, for limiting the output voltage of said logic gate by clamping said output voltage to a maximum value.

8. A logic gate according to claim 7 wherein said emitter current controlling means comprises:

a current regulating transistor means having a collector electrode coupled to said second node, an emitter electrode coupled to a ground reference coupling and a base electrode coupled through a third node to a biasing means, said biasing means being coupled to said first node; and a first Schottky diode having a cathode electrode coupled to said second node and an anode electrode coupled to said third node, said transistor means being NPN transistors.

9. A logic gate according to claim 7 wherein said biasing means comprises:

a feedback resistor, said feedback resistor being coupled between said first node and said third node such that a change in voltage level at said first node causes a controlled change in voltage level and current at said third node to control base current to said current regulating transistor; and a clamping means coupled across said feedback resistor for limiting voltage drop across said feedback resistor in order to inhibit saturation of input elements of other gates driven from said first node.

* * * * *